United States Patent [19]
Arntz et al.

[11] Patent Number: 5,171,413
[45] Date of Patent: Dec. 15, 1992

[54] METHODS FOR MANUFACTURING SOLID STATE IONIC DEVICES

[75] Inventors: Floyd O. Arntz, Newton; Ronald B. Goldner, Lexington; Terry E. Haas, Sudbury; Guang Wei, Somerville; Kwok-Keung Wong, Watertown, all of Mass.

[73] Assignee: Tufts University, Medford, Mass.

[21] Appl. No.: 760,445

[22] Filed: Sep. 16, 1991

[51] Int. Cl.⁵ .............................................. C23C 14/34
[52] U.S. Cl. ........................ 204/192.15; 204/192.26; 204/192.29
[58] Field of Search .................. 204/192.15, 192.26, 204/192.27, 192.28, 192.29

[56] References Cited
U.S. PATENT DOCUMENTS

| | | | |
|---|---|---|---|
| 4,832,463 | 5/1989 | Goldner et al. | 350/357 |
| 4,876,628 | 10/1989 | Goldner et al. | 361/313 |
| 4,889,414 | 12/1989 | Rauh et al. | 350/357 |

OTHER PUBLICATIONS

R. Goldner et al., "Progress on the variable reflectivity electrochromic window," presented at SPIE meeting, San Diego, CA Jul. 25, 1991.
G. Wei et al., Proc. Electrochem. Soc., vol. 90-2, pp. 80-88 (1990).
R. Goldner et al., Solid State Ionics, vol. 28-30, pp. 1715-1721 (1988).
F. Arntz et al., Proc. SPIE, vol. 1149, pp. 40-45 (1989).
F. Arntz et al., J. Appl. Phys., vol. 67, No. 6, pp. 3177-3179 (1990).
T. Haas et al., Proc. SPIE, vol. 823, pp. 81-83 (1987).
P. Yu et al., Mat. Res. Soc. Symp. Proc., vol. 210, pp 63-68 (1991).
R. Goldner et al., Solar Energy Materials, vol. 11, pp. 177-185 (1984).
F. Shokoohi et al., abstract entitled "Fabrication of Lithium-Based Cathode Thin Films for Secondary Batteries," published at the 1990 Fall Meeting of Mater, Res. Soc., Boston MA (Nov. 26, 1990 to Dec. 1, 1990).
T. Haas et al., abstract entitled "Preparation, Characterization and Electrochrosim of Thin Film Lithium Cobalt Oxides," published at the 18th NE Reg. Meeting of Am. Chem. Soc., Orono, ME, Jul. 31, 1988 to Aug. 3, 1988.

*Primary Examiner*—Nam X. Nguyen
*Attorney, Agent, or Firm*—Kriegsman & Kriegsman

[57] ABSTRACT

A multilayer, thin film solid state ionic device usable as an electrochromic window and/or as a rechargeable battery and a method for its manufacture. In one embodiment, the device comprises a transparent substrate and a thin film, five layered coating, the coating being deposited onto the substrate. The device is made by depositing a first layer of indium tin oxide onto the substrate, depositing a second layer of tungsten trioxide onto the first layer, inserting a quantity of lithium ions into the second layer so as to form a lithium-enriched second layer, depositing a third layer of lithium niobate onto the lithium-enriched second layer, sputter depositing a fourth layer of $LiCoO_2$ onto the third layer, whereby the fourth layer is lithium-deficient, applying, in the presence of a plasma, a sufficiently large positive electrical potential to the second layer so as to cause virtually all of the lithium ions inserted thereinto to be expelled therefrom, whereby a quantity of lithium ions are added to the fourth layer to ameliorate its lithium deficiency and whereby any lithium ions expelled from the second layer but not needed to cure the deficiency of lithium ions in the fourth layer are expelled into the plasma, and then depositing a fifth layer made of indium oxide onto said fourth layer.

16 Claims, 2 Drawing Sheets

METHODS FOR MANUFACTURING SOLID STATE IONIC DEVICES

BACKGROUND OF THE INVENTION

The present invention relates generally to solid state ionic devices and more particularly to multilayer, thin film solid state ionic devices which may be used as electrochromic windows and/or as rechargeable batteries.

Approximately 40% of the annual national energy consumption is used to control the climate of building interiors, i.e. to heat building interiors in the cooler months and to cool building interiors in the warmer months. Of this amount, approximately 33% is wasted, primarly due to radiation loss through building windows. For example, radiation loss occurs on warm days as solar energy is transmitted into the building interior through windows, causing the interior to be warmed and, consequently, requiring additional energy to be expended to cool the building interior. Additionally, radiation loss occurs on cool days as thermal infrared radiation present within the building interior escapes through building windows, thereby requiring additional energy to be expended as heat to warm the building interior.

One proposed solution to the problem of radiation loss has involved the use of electrochromic windows having variable absorption. The idea behind such windows is that, by absorbing solar energy, the windows prevent solar energy from entering the building interior and, therefore, from heating the building interior. Unfortunately, however, such windows frequently become very hot as a result of absorbing solar energy. Moreover, the windows ultimately re-radiate approximately 50% of the absorbed energy into or out of the building interior, resulting in thermal transfer inefficiencies.

A second proposed solution to the problem of radiation loss has involved the use of electrochromic windows having variable reflectance over a broad bandwidth of radiation. Using such windows, it is possible, for example, on warm days to transmit the visible portion of the solar spectrum so as to illuminate the building interior while reflecting the ultraviolet and infrared components of the solar spectrum so as to decrease the cooling load and, additionally, on cool days to transmit into the building interior the entire solar spectrum so as to both illuminate and heat the building interior while reflecting back into the building interior thermal infrared radiation already generated therewithin. Examples of variable reflection electrochromic windows are described in U.S. Pat. Nos. 4,889,414, 4,832,463, and 4,876,628, all of which are incorporated herein by reference.

According to the teachings of the aforementioned patents, a variable reflection electrochromic window typically comprises a transparent substrate and a thin film, multilayer coating whose transmissivity is adjustable by the transport of electrons and ions therethrough. Typically, the coating includes five layers, the first layer being a transparent electronically conductive layer which is deposited on the substrate, the second layer being an electrochromic layer whose spectral selectivity is adjustable, the third layer being an ion-conductive, electron-resistive layer capable of reversibly transporting positive metal ions into and out of the electrochromic layer so as to transform said electrochromic layer to and from an optically reflective state, the fourth layer being a counter-electrode layer capable of donating and receiving electrons and ions to and from said electrochromic layer, and the fifth layer being a transparent electronically conductive layer. As can readily be recognized, the first and fifth layers function merely as transparent electrical contacts for dispersing electrons over the surfaces of the second and fourth layers, respectively, and can be omitted from the device if desired.

In a preferred arrangement, the first and fifth (i.e. electron conductor) layers are formed from indium tin oxide; the second (i.e. electrochromic) layer is formed from $WO_3$; the third (i.e. ion conductor) layer is formed from $Li_2O:Nb_2O_5$; and the fourth (i.e. counter-electrode) layer is formed from $LiCoO_2$. When an externally-generated electric field of the proper polarity is applied to the multilayered structure, lithium ions migrate from the $LiCoO_2$ layer to the $WO_3$ layer and become incorporated into the polycrystalline structure of $WO_3$. The incorporation of lithium ions into the polycrystalline structure of $WO_3$ causes that layer to become "colored," i.e., reflective to certain wavelengths of radiation. In a complementary fashion, the removal of lithium ions from $LiCoO_2$ causes that layer also to become "colored."

Typically, all five of the above-described layers are deposited by a sputtering technique, such as by rf diode sputtering. However, the quality of some of those layers formed by sputtering is frequently less than desired. For example, as pointed out in U.S. Pat. Nos. 4,876,628 and 4,832,463, one of the difficulties in rf diode sputtering a mixed phase oxide resulting in stoichiometric $Li_2O:Nb_2O_5$ for the third layer is that, when stoichiometric quantities of $Li_2O$ and $Nb_2O_5$ are prepared for rf sputtering onto the electrochromic layer, the resulting mixed phase oxides of lithium and niobium are less than stoichiometric and hence do not exhibit the optimum ionic conductivity and maximum electronic resistivity, as required within electrochromic layered structures.

One method for compensating for the loss of lithium ions during deposition of the third layer as disclosed in the aforementioned patents involves inserting lithium ions into the second layer via plasma injection before application of the third layer. As can be appreciated, however, this method itself creates a problem since the deposited lithium ions incorporate themselves in great numbers into the $WO_3$ layer, causing that layer to be residually colored even when the electrochromic window has been switched so as to be in a transparent or "bleached" state.

In addition to causing the problems discussed above in connection with the deposit of the lithium niobate layer, sputtering techniques also typically result in a less than stoichoimetric deposit of the $LiCoO_2$ layer, i.e., the composition of the resultant layer is $Li_xCoO_2$ wherein x is less than 1.0. Because the $LiCoO_2$ layer is thus only partially lithiated, its spectral transmissivity cannot be fully modulated, i.e., it cannot be switched completely to a transparent or "bleached" state. Moreover, no method for altering the stoichiometry of the $Li_xCoO_2$ layer (i.e., increasing the value of x), once it has been thus deposited, has heretofore been known.

As can readily be appreciated, the above described electrochromic window can also be used as a rechargeable battery with the $LiCoO_2$ layer serving as the cathode and the electrochromic layer serving as the anode. (It should be recognized that, in battery applications, the transparency of the substrate and the first and fifth layers as well as the electrochromicity of the second layer is unnecessary.) As discussed above, because the LiCoO$_2$ layer of such a battery is lithium deficient, less charge can be transferred during its charging or discharging, thereby diminishing its usefulness as a battery.

SUMMARY OF THE INVENTION

The present invention is based on the discovery that the above-described problems resulting from the insertion of lithium into the electrochromic layer and from the deficiency of lithium in the counter-electrode layer can be ameliorated by a processing step which may be performed either during deposition of the counter-electrode layer or after deposition of the counter-electrode layer and before deposition of the second electron conductor layer (if a second electron conductor layer is to be deposited). This processing step involves, in one embodiment, striking a plasma between the as-coated substrate and a target and, in the presence of this plasma, applying a biasing d.c. voltage to the electrochromic layer for a period of time sufficient to expel virtually all of the lithium ions inserted thereinto, whereby a quantity of lithium ions are added to the counter-electrode layer. If the plasma is a lithium-enriched plasma, the lithium ions added to the counter-electrode layers are transferred, in part, from the plasma and, in part, from the electrochromic layer. If the plasma is not a lithium-enriched plasma, the lithium ions added to the counter-electrode are transferred solely from the counter-electrode layer. The number of lithium ions added to the counter-electrode layer does not exceed the number of lithium ions needed to cure the lithium-deficiency therein; all surplus lithium ions are expelled into the plasma.

Objects, features and advantages of the present invention will be set forth in part in the description which follows, and in part will be obvious from the description or may be learned by practice of the invention. The objects, features, and advantages of the invention may be realized and attained by means of the instrumentalities and combinations particularly pointed out in the appended claims.

BRIEF DESCRIPTION OF THE DRAWINGS

The accompanying drawings, which are hereby incorporated into and constitute a part of this specification, illustrate the preferred embodiments of the invention and, together with the description, serve to explain the principles of the invention. In these drawings wherein like reference numerals represent like parts.

DETAILED DESCRIPTION OF PREFERRED EMBODIMENTS

Figure 1:
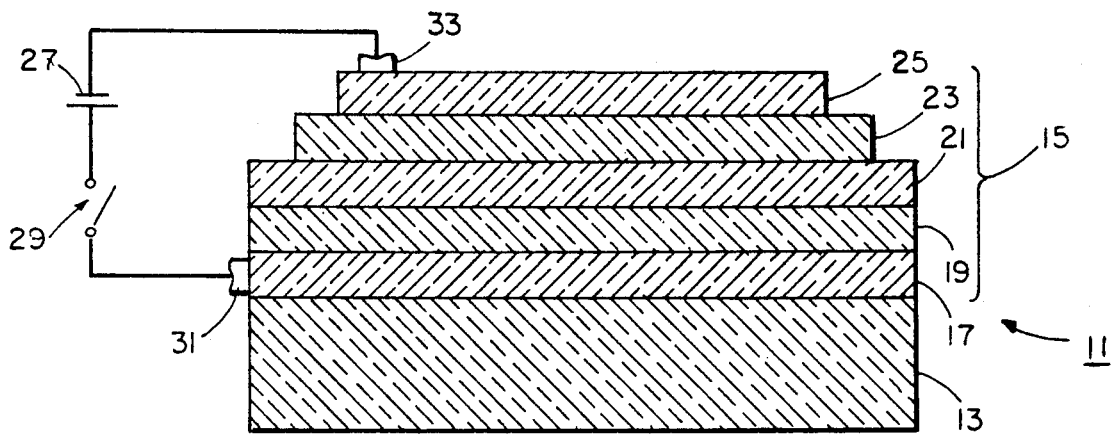
FIG. 1 is a schematic, cross-sectional view of one embodiment of a multilayer, thin film, solid state ionic device constructed according to the teachings of the present invention, the device being shown electrically coupled through a switch to a power source.

Referring now to the drawings and more particularly to FIG. 1, there is shown one embodiment of a multilayer, thin film solid state ionic device constructed according to the teachings of the present invention, the device being represented generally by reference numeral 11.

Device 11, which may be used either as an electrochromic window or as a rechargeable battery, includes a transparent substrate 13. Substrate 13 may be made of glass, in which case device 11 may be used to replace a plate glass window which has already been installed in a building or may be placed next to such a window, or may be made of a thin, flexible plastic, in which case device 11 may be adhered either to the interior or to the exterior of an already installed plate glass window. If substrate 13 is made of glass, it preferably includes a sodium barrier layer.

Device 11 also includes a thin film, multilayer coating 15 which is deposited onto substrate 13. Coating 15 includes a transparent, electron-conductive layer 17, which may be made, for example, of indium tin oxide, doped tin oxide or doped zinc oxide. Preferably, layer 17 has a thickness of about 1000–1800 Angstroms.

An ion-conductive, electron-conductive layer 19 is deposited onto layer 17. Layer 19, which may be made, for example, of one or more of the oxides of W, Mo, V, Nb, Ta, Ni and/or Ti, is an intercalation host which undergoes reversible lithium ion insertion with an accompanying change in color. In a preferred embodiment, layer 19 is made of WO$_3$ and has a thickness of about 1000–1800 Angstroms.

An ion-conductive, electron-resistive layer 21 is deposited onto layer 19. Layer 21, which may be made of an amorphous, stoichiometric mixture of lithium oxide and one or more metal oxides, such as tantalum oxide and niobium oxide, preferably has a thickness of about 3000–5000 Angstroms.

An ion-conductive, electron-conductive layer 23 is deposited onto layer 21. Layer 23, which includes one or more compounds having the formula Li$_y$MO$_2$ wherein M is a transition metal of the third, fourth or fifth row of the periodic table, has a thickness of about 1000–3000 Angstroms. Preferably, layer 23 includes stoichiometric LiCoO$_2$. To prevent electrical shorting from occurring between layers 23 and layers 19 and/or 17, layer 23 is pyramided relative to layer 21.

A transparent electron-conductive layer 25 is deposited on top of layer 23. Layer 25 which may be made of, for example, indium oxide, indium tin oxide or doped zinc oxide, has a thickness of about 800–2000 Angstroms. Also to prevent electrical shorting, layer 25 is pyramided relative to layer 23.

To control the flow of lithium ions between layers 19 and 23 when device 11 is in use, a reversible, low voltage (i.e. preferably lower than about 10 volts and more preferably less than about 3 volts) power source 27 is coupled through a switch 29 to a pair of electrodes 31 and 33 mounted on layers 17 and 25, respectively.

Coating 15 may be made as follows: Layer 17 is first deposited onto substrate 13, preferably by a sputtering technique, more preferably by rf diode sputtering. Layer 19 is then deposited onto layer 17, preferably by a sputtering technique, more preferably by rf diode sputtering. Typically, but not necessarily, the sample is grounded during the depositions of layers 17 and 19. Then, in accordance with the teachings of U.S. Pat. Nos. 4,832,463 and 4,876,628, which are discussed above and which are incorporated into the present specification by reference, a quantity of lithium ions is inserted into layer 19 via plasma injection or by a similar technique. Preferably, the sample is kept electrically floating during this step. The number of lithium ions inserted into layer 19 is sufficient to give layer 19 a darkly colored appearance. Layer 21 is then deposited onto layer 19, preferably by a sputtering technique, more preferably by rf diode sputtering. Preferably, a sputter-up technique is used to deposit layer 21 so as to minimize the incorporation of impurities thereinto, which may deleteriously affect the performance of layer 21. Layer 23 is then deposited onto layer 21 by a sputtering technique, preferably by rf diode sputtering. To prevent layer 23 from being deposited near the periphery of layer 21, a mask (not shown) is placed over layer 21 during the deposition of layer 23 thereonto. Preferably, the sample is kept electrically floating during the deposition of layers 21 and 23. However, the application of a biasing current to the sample, either intermittently or continuously, during deposition of layers 21 and/or 23 may be beneficial.

As discussed above, because the target used to make layer 23 typically includes one or more materials of the formula $Li_yMO_2$, the resultant sputter-deposited layer is almost invariably lithium-deficient. This lithium deficiency gives layer 23 a darkly colored appearance. Accordingly, to ameliorate the lithium-deficiency in layer 23 while, at the same time, purging layer 19 of those lithium ions inserted thereinto, the sample is then subjected to a novel processing step using the arrangement shown in FIG. 2 and described below.

Figure 2:
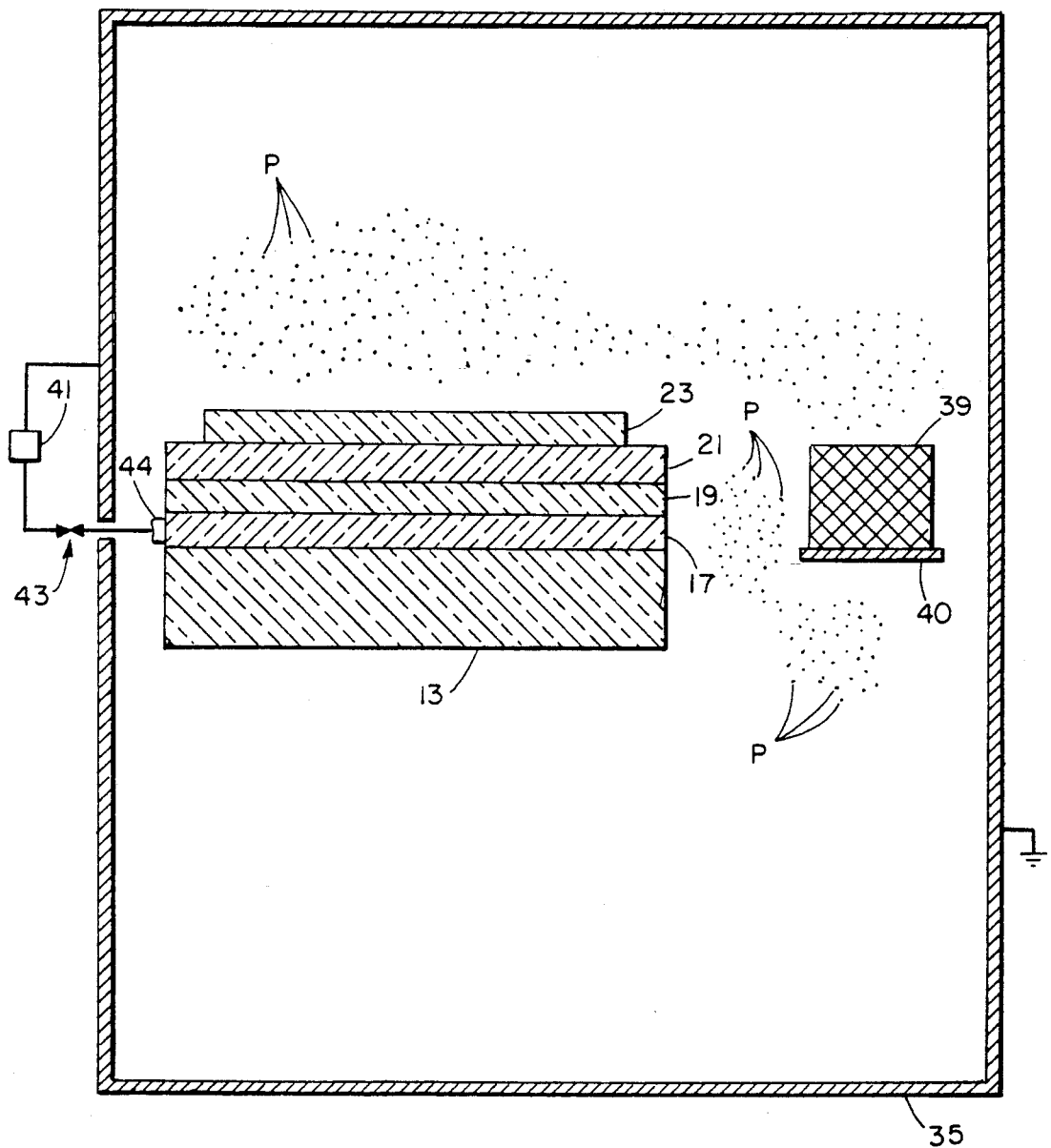
FIG. 2 is a schematic, cross-sectional view of a portion of the device shown in FIG. 1, the portion of the device being electrically connected to a biasing voltage to illustrate the novel processing step of the present invention.

As can be seen in FIG. 2, this processing step takes place within a sputtering chamber 35, with a plasma P struck between the sample and a target 39 mounted on a sputtering station 40. Target 39 may be any composition which is capable of serving as a plasma electrode and which will not contaminate the sample. Examples of suitable target materials include lithium carbonate, lithium cobalt dioxide, silicon carbide and aluminum. In the presence of a plasma thus struck, a biasing voltage source 41, such as a potentiostat, is used to send a positive current through a switch 43 to an electrode 44 mounted on layer 17. Chamber 35 typically serves as the opposing electrode with the plasma electrically coupling the sample to chamber 35. The positive current causes the positively charged lithium ions, which are disposed in layer 19, to be expelled therefrom. At least a portion of the expelled lithium ions migrate through coating 15 and are added to layer 23. Also, as noted above, if plasma P is a lithium-enriched plasma, a portion of the lithium ions present therein are added to layer 23. Surplus lithium ions, i.e., those lithium ions derived from layer 19 but not needed to cure the deficiency of lithium ions in layer 23, are expelled into the plasma.

The exact magnitude and/or duration of the current applied to layer 19 is not critical; instead, what is important is that sufficient positive charge be applied to layer 19 to expel virtually all of the lithium ions present therein. Typically, this can be approximated by observing a change in the appearance of layer 19 from a darkly colored state to a transparent state.

One advantage of the above-described processing step is that the lithium cobalt dioxide deposition step may be performed at temperatures as low as, for example, about 15–30 degrees C., instead of at temperatures approaching 300 degrees C. and higher as required by other deposition procedures.

After performing the above-described processing step, it may improve the transparency of the sample to perform one or more times a cyclical process involving, firstly, applying a biasing voltage of the opposite polarity as used in the above-described processing step to the sample to transfer lithium ions from layer 23 to layer 19 and then, secondly, applying a biasing voltage of the same polarity as used in the processing step to transfer back to layer 23 those lithium ions transferred in the previous step to layer 19.

Layer 25 is then deposited onto layer 23, preferably by reactive vapor deposition, typically at elevated temperatures of about 300 degrees C. and higher. Alternatively, before depositing layer 25, one could separately anneal the sample in a passive or vacuum environment at a temperature exceeding 200 degrees C., or one could thermally cycle the sample at about 300 degrees C. under near-vacuum conditions. (It has been found that heating the sample to elevated temperatures such as these at this stage of manufacture typically increases the transparency of the sample.) To prevent layer 25 from being deposited near the periphery of layer 23, a mask (not shown) is placed over layer 23 during deposition of layer 25 thereonto.

The following examples illustrate specific operating conditions under which various embodiments of device 11 were manufactured. All of the embodiments described below were found to work satisfactorily when used as an electrochromic window and/or as a rechargeable battery. It is to be understood, however, that the examples below are merely illustrative and are not intended in any way to be limiting of the present invention.

EXAMPLE 1

The substrate, a one mm thick soda-lime glass plate 50 mm×75 mm in size was cleaned and placed onto a platten in a standard rf sputter deposition station having two 125 mm diameter sputter targets at a distance of 60 mm. One target was made of indium tin oxide; the other was made of tungsten trioxide. The substrate was centered under the indium tin oxide substrate, electrically grounded, and heated to 440 degrees C. Rf power was then applied to the indium tin oxide target at a power level of 200 W for one hour under a pressure of 10 millitorr of oxygen, resulting in a deposition of indium tin oxide having a thickness of approximately 1200 Angstroms.

The substrate support was then rotated to center the sample under the tungsten trioxide target. Under the same conditions of ambient pressure and substrate temperature, rf power was directed to the tungsten trioxide target at a power level of 200 W for one hour, resulting in a deposition having a thickness of approximately 1500 Angstroms.

The sample was then subjected to upward sputter deposition from a 125 mm diameter target of lithium carbonate located at a distance of 50 mm by applying 100 W of rf power for 6 minutes under a pressure of 10 millitorr of argon. During this step, the sample was clamped to an electrically floating metal plate maintained at approximately 15–30 degrees C. As a result of this lithium-enriching step, the sample acquired a uniform deep sky-blue color.

The lithium carbonate target was then replaced with a 125 mm diameter target of lithium niobate. The sample, which remained clamped to an electrically floating metal plate maintained at approximately 15–30 degrees C., was then subjected to 180 minutes of rf sputtering at an rf power level of 100 W in an argon ambient at 10 millitorr, resulting in a lithium niobate layer having an approximate thickness of 3000 Angstroms.

The lithium niobate target was then replaced with a target comprised of a 125 mm diameter shallow well containing lithium cobalt dioxide powder. An aluminum stencil mask with six evenly spaced 15 mm diameter apertures was then applied to the sample, which still remained clamped to an electrically floating metal plate maintained at approximately 15–30 degrees C. Rf power was directed to the lithium cobalt dioxide target at a power level of 80 W for 120 minutes in an ambient pressure of 14 millitorr of oxygen and 6 millitorr of argon.

The target was then replaced by a 125 mm$^2$ silicon carbide target with a grounded 100 mm diameter aluminum aperture above it for the processing step. An rf discharge at 20 W in 12 millitorr of argon was established while a positive potential was applied to the sample and mask relative to the chamber wall. The sample was maintained at a temperature of about 15–30 degrees C. While observing the color of the sample through a chamber window, the discharge was maintained with the applied emf as large as 40 volts and with as much as 11 milliamperes flowing. The discharge was discontinued when the sample appeared to the naked eye to be transparent, i.e. after about 3 minutes.

Finally, the sample was transferred to a vacuum system in which six 12 mm diameter transparent indium oxide contacts were applied through a stencil mask in registration over the pattern of islands of lithium cobalt dioxide. This layer was produced by evaporating indium from a hot tungsten boat at a distance of 250 mm in an ambient of 1.5 millitorr of oxygen. The deposition rate was 0.1 nm per second and the sample was maintained at a temperature of 300 degrees C. by a contacting joule heater.

EXAMPLE 2

The method performed was the same as that performed in Example 1 except for the following differences. First, the lithium-enriching step involved sputtering lithium carbonate onto the tungsten trioxide layer for 11 minutes, instead of for 6 minutes. Second, the plasma-bleaching step was performed using a lithium cobalt dioxide target, instead of a silicon carbide target, and a biasing voltage of 6 milliamperes for 9 minutes, instead of 11 milliamperes for about 3 minutes.

EXAMPLE 3

The method performed was the same as that performed in Example 2 except for the following differences. First, the lithium niobate sputtering step was performed for 240 minutes, instead of for 180 minutes. Second, the lithium cobalt dioxide sputtering step was performed using an rf power of 100 W, instead of 80 W. Third, the plasma-bleaching step was performed in an ambient pressure of 10 millitorr of argon and 2 millitorr of oxygen, instead of 12 millitorr of argon.

EXAMPLE 4

The method performed was the same as that performed in Example 2 except for the following differences. First, the lithium-enriching step was performed for 15 minutes, instead of for 11 minutes. Second, the plasma-bleaching step involved applying the biasing voltage for 3 minutes, instead of for 9 minutes.

EXAMPLE 5

The method performed was the same as that performed in Example 4 except that the lithium-enriching step was performed for 6 minutes, instead of for 15 minutes.

Other variations in the above-described examples which are expected to work include sputter depositing tungsten trioxide in an ambient pressure of 4 millitorr of oxygen, rather than 10 millitorr of oxygen, and following the lithium niobate depositing step with an additional ten minutes of sputtering lithium niobate at an rf power of 100 W in an ambient pressure of 14 millitorr of argon and 6 millitorr of oxygen under the same sample conditions.

In addition, it has been found that superior $Li_yMO_2$ deposits are obtained by using targets of $Li_yMO_2$ powder enriched with $Li_2CO_3$ powder (typically about 0.1 molar).

Figure 3:
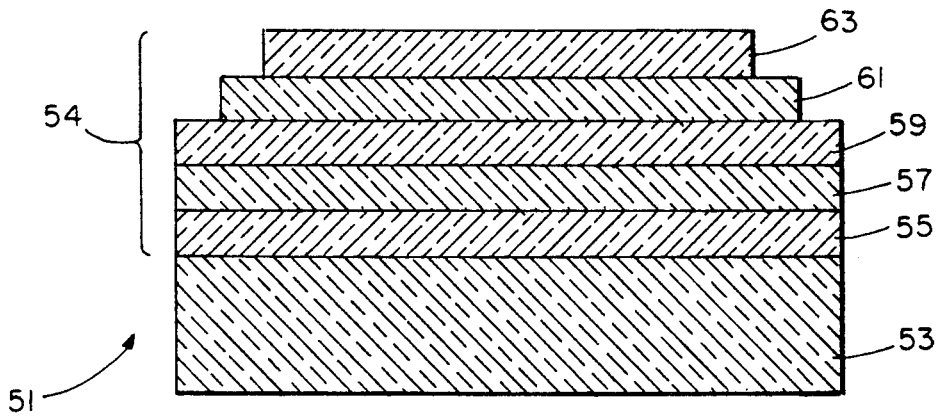
FIG. 3 is a schematic, cross-sectional view of another embodiment of a multilayer, thin film, solid state ionic device constructed according to the teachings of the present invention, the device being usable as a rechargeable battery.

As can readily be appreciated, other embodiments of the present invention can be made using the procedures described above. For example, in FIG. 3 there is shown another embodiment of a device made in accordance with the present invention, this device being particularly well-suited for use as a rechargeable battery and being represented generally by reference numeral 51.

Device 51 includes a substrate 53 made of a metal foil, such as copper, nickel or aluminum, and a thin film, multilayer coating 54 deposited on substrate 53. Coating 54 is made first by depositing a first electron-conductive, lithium-resistive layer 55 made of, for example, copper onto substrate 53. Next, an electron-conductive, lithium-conductive layer 57 made of, for example, a Li/Al or Li$_3$/Bi alloy is deposited onto layer 55. Layer 57 is then enriched with lithium ions in the manner described above, and an electron-resistive, lithium-conductive layer 59 made of, for example, lithium niobate, lithium silicon phosphate, lithium borate, lithium tantalate, lithium phosphate, or the like is deposited onto layer 57. Next, an electron-conductive, lithium-conductive layer 61 made of, for example, lithium cobalt dioxide or lithium vanadium oxide is sputter deposited onto layer 55, and the processing step described above is performed to remove the lithium ions from layer 57 and to add a quantity of lithium ions to layer 61. Finally, a second electron-conductive, lithium-resistive layer 63 made of, for example, copper is deposited onto layer 61.

Figure 4:
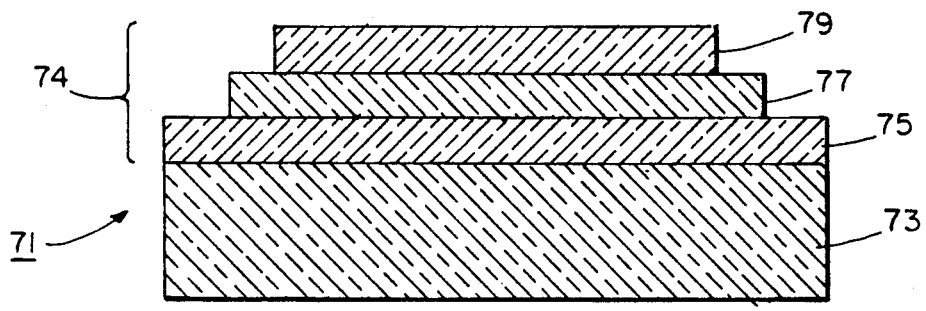
FIG. 4 is a schematic, cross-sectional view of a third embodiment of a multilayer, thin film, solid state ionic device constructed according to the teachings of the present inventio, the device being usable as a rechargeable battery.

Referring now to FIG. 4, there is shown still another embodiment of a device constructed according to the method described above, the device being represented generally by reference numeral 71.

Device 71, which is also particularly well-suited for use as a rechargeable battery, includes a substrate 73 made of an electron-conductive, lithium-conductive material such as a Li/Al or Li$_3$/Bi alloy and a thin film, trilayer coating 74 deposited onto substrate 73. Coating 74 is made first by lithium-enriching substrate 73 in the manner described above and then by depositing thereonto an electron-resistive, lithium-conductive layer 75 made of, for example, lithium niobate, lithium silicon phosphate, lithium borate, lithium tantalate, lithium phosphate, or the like. An electron-conductive, lithium-conductive layer 77 made of, for example, lithium cobalt dioxide or lithium vanadium oxide is then sputter deposited onto layer 75, and the processing step described above is performed to remove the lithium ions from substrate 73 and to add a quantity of lithium ions to layer 77. Finally, an electron-conductive, lithium-resistive layer 79 made of, for example, a metal such as copper is deposited onto layer 77.

The embodiments of the present invention recited herein are intended to be merely exemplary and those skilled in the art will be able to make numerous variations and modifications to it without departing from the spirit of the present invention. For example, sodium, potassium, silver, hydrogen and/or other similarly charged ions could be used instead of lithium ions in the second and fourth layers of the device. In addition, the device may further include one or more lithium blocking layers made of, for example, silicon carbide or zinc oxide. All such variations and modifications are intended to be within the scope of the present invention as defined by the claims appended thereto.

What is claimed is:

1. A method for preparing a multilayer thin film solid state ionic device comprising the steps of:
   a) providing a substrate;
   b) depositing a first layer including one or more electron-conductive, lithium-resistive materials onto said substrate;
   c) depositing a second layer including one or more electron-conductive, lithium-conductive materials onto said first layer;
   d) inserting a quantity of lithium ions into said second layer so as to form a lithium-enriched second layer;
   e) depositing a third layer including one or more electron-resistive, lithium-conductive materials onto said lithium-enriched second layer;
   f) sputter depositing onto said third layer a fourth layer including one or more electron-conductive, lithium-conductive materials having the formula $Li_yMO_2$ wherein M is a transition metal of the third, fourth, or fifth row of the periodic table, whereby said fourth layer is lithium-deficient;
   g) applying, in the presence of a plasma, a positive electrical potential to said second layer until virtually all of the lithium ions present therein are expelled therefrom, whereby a number of lithium ions are added to said fourth layer, said number of lithium ions added to said fourth layer not exceeding the number of lithium ions needed to cure the lithium-deficiency therein; and
   h) depositing a fifth layer including one or more electron-conductive, lithium-resistive materials onto said fourth layer.

2. The method as claimed in claim 1 wherein said plasma is a non-lithium enriched plasma and wherein the lithium ions added to said fourth layer are transferred thereto solely from said second layer.

3. The method as claimed in claim 2 wherein said plasma is struck using a target material selected from the group consisting of silicon carbide, aluminum, lithium carbonate, and lithium cobalt dioxide.

4. The method as claimed in claim 2 wherein said applying step is performed at a temperature of about 15-30 degrees C.

5. The method as claimed in claim 1 wherein said step of sputter depositing said fourth layer is performed at a temperature of about 15-30 degrees C.

6. The method as claimed in claim 1 wherein said steps of inserting lithium into said second layer, depositing said third layer, and sputter depositing said fourth layer are performed with said substrate and any layers deposited thereonto kept electrically floating.

7. The method as claimed in claim 1 wherein said step of sputter depositing said fourth layer comprises sputter depositing one or more materials having the formula $Li_yMO_2$ wherein M is a transition metal of the third row of the periodic table.

8. The method as claimed in claim 7 wherein said step of sputter depositing said fourth layer comprises sputter depositing $LiCoO_2$.

9. The method as claimed in claim 1 wherein said step of inserting lithium into said second layer comprises sputtering lithium carbonate thereonto.

10. The method as claimed in claim 1 wherein said step of depositing said fifth layer is performed using reactive vapor deposition at elevated temperatures.

11. The method as claimed in claim 1 wherein said steps of sputter depositing said fourth layer and depositing said fifth layer are performed with masks so that said fourth layer is pyramided relative to said third layer and said fifth layer is pyramided relative to said fourth layer.

12. The method as claimed in claim 1 wherein said fourth layer is sputter deposited from a target of $Li_yMO_2$ powder enriched with $Li_2CO_3$ powder.

13. The method as claimed in claim 1 wherein said plasma is a lithium-enriched plasma and wherein the lithium ions added to said fourth layer are transferred both from said second layer and from said lithium-enriched plasma.

14. The method as claimed in claim 1 further comprising, after the step of applying said positive electrical potential in the presence of a plasma and before the step of depositing said fifth layer, annealing said substrate and any layers deposited thereonto at about 300 degrees C. under vacuum conditions.

15. A method for preparing a multilayer thin film solid state ionic device comprising the steps of:
   a) providing a substrate including one or more electron-conductive, lithium-conductive materials;
   b) inserting a quantity of lithium ions into said substrate so as to form a lithium-enriched substrate;
   c) depositing a first layer including one or more electron-resistive, lithium-conductive materials onto said substrate;
   d) sputter depositing onto said first layer a second layer including one or more electron-conductive, lithium-conductive materials having the formula $Li_y MO_2$ wherein M is a transition metal of the third, fourth, or fifth row of the periodic table, whereby said second layer is lithium-deficient;
   e) applying, in the presence of a plasma, a positive electrical potential to said second layer until virtually all of the lithium ions present therein are expelled therefrom, whereby the lithium-deficiency of said second layer is ameliorated; and
   f) depositing a third layer including one or more electron-conductive, lithium-resistive materials onto said second layer.

16. A method for preparing a multilayer thin film solid state ionic device comprising the steps of:
   (a) providing a substrate;

(b) after step (a), depositing a layer of one or more electron-conductive, lithium-resistive materials;
(c) after step (b), depositing a layer of one or more electron-conductive, lithium-conductive materials;
(d) after step (c), inserting a quantity of lithium ions into the layer deposited in step (c);
(e) after step (d), depositing a layer of one or more electron-resistive, lithium-conductive materials;
(f) after step (e), sputter depositing a layer of one or more electron-conductive, lithium-conductive materials having the formula $Li_yMO_2$ wherein M is a transition metal of the third, fourth, or fifth row of the periodic table;
(g) after step (f), applying, in the presence of a plasma, a positive electrical potential to said second layer so as to cause at least some of the lithium ions inserted thereinto to be expelled therefrom; and
(h) after step (g), depositing a layer of one or more electron-conductive, lithium-resistive materials.

* * * * *